United States Patent

Aizawa

Patent Number: 4,479,065
Date of Patent: Oct. 23, 1984

[54] CHATTERING PREVENTIVE CIRCUIT

[75] Inventor: Hitomi Aizawa, Suwa, Japan

[73] Assignee: Kabushiki Kaisha Suwa Seikosha, Tokyo, Japan

[21] Appl. No.: 382,431

[22] Filed: May 26, 1982

[30] Foreign Application Priority Data

May 28, 1981 [JP] Japan ............................. 56-81369

[51] Int. Cl.³ ............................................. H03K 17/56
[52] U.S. Cl. ............................. 307/247 R; 307/247 A; 307/269
[58] Field of Search ................ 307/247 A, 246, 269; 340/365 E

[56] References Cited

U.S. PATENT DOCUMENTS

| | | | |
|---|---|---|---|
| 4,057,738 | 11/1977 | Nishimura | 307/247 A |
| 4,198,579 | 4/1980 | Ebihara et al. | 307/247 A |
| 4,417,155 | 11/1983 | Aizawa | 307/247 A |

*Primary Examiner*—Stanley D. Miller
*Assistant Examiner*—B. P. Davis

*Attorney, Agent, or Firm*—Blum, Kaplan, Friedman, Silberman & Beran

[57] ABSTRACT

A chattering preventive circuit for preventing chattering in a switch having a mechanical contact. The circuit includes a switch element for producing an input signal representative of the open and closed states of the switch and also includes a periodic pulse signal. A first memory circuit receives the input signal and the periodic pulse signal and produces a write-in signal representative of the coincidence of the input signal and the periodic pulse signal. A second memory circuit receives the write-in signal and the periodic pulse signal and produces an output signal representative of the closed state of the switch element only when the switch element is kept closed for at least a predetermined time period. The second memory circuit will not produce the next output signal representative of another closing of the switch element unless the switch element first remains open for at least a predetermined time prior to reclosing.

9 Claims, 5 Drawing Figures

CHATTERING PREVENTIVE CIRCUIT

BACKGROUND OF THE INVENTION

This invention is directed to a circuit for preventing chatter in a switch having a mechanical contact, and in particular to an input chattering preventive circuit particularly adapted for use in miniature portable equipment.

It has been recognized that a switch having a mechanical contact invites chattering thereof while being used. Accordingly, circuits have been developed to suppress chattering before the signal produced by the switch is used as an input. For example, an electronic circuit for eliminating chatter from a contact signal is disclosed in U.S. Pat. No. 4,057,738. Another anti-chatter circuit for use in a small portable apparatus is disclosed in my co-pending U.S. patent application Ser. No. 06/277,293, filed June 25, 1981, now U.S. Pat. No. 4,417,155. Although such circuits act to substantially eliminate chatter, an improved chattering preventive circuit for use in miniature portable equipment such as calculators and watches which effectively eliminates chatter is desired.

SUMMARY OF THE INVENTION

Generally speaking, in accordance with the present invention, a chattering preventive circuit for eliminating the chatter in a switch having a mechanical contact is provided. The chattering preventive circuit includes a switch element for producing an input signal representative of the open and closed states of the switch element and also includes a periodic pulse signal. A first memory circuit receives the input signal from the switch element and the periodic pulse signal and produces a write-in signal representative of the coincidence of the input signal and the periodic pulse signal. A second memory circuit receives the write-in signal from the first memory circuit and the periodic pulse signal and produces an output signal representative of the closed state of the switch element.

The chattering preventive circuit is so constructed that the second memory circuit will not put out its output signal unless the switch element is kept closed for a predetermined period of time. The second memory circuit will not output a second output signal unless the switch is thereafter kept open for greater than a predetermined period of time before closing again.

Accordingly, it is an object of the present invention to provide an improved chattering preventive circuit.

Another object of the present invention is to provide an improved chattering preventive circuit particularly suited for use in miniature portable equipment.

A further object of the present invention is to provide a chattering preventive circuit which produces an output signal only when a switch is kept closed for at least a predetermined period of time.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENT

Figure 1:
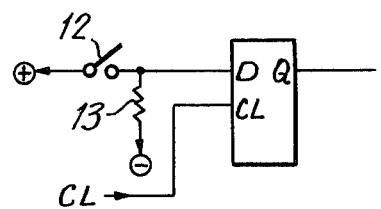
FIG. 1 is a circuit diagram of a chattering preventive circuit constructed in accordance with the prior art.

Reference is first made to FIG. 1, which depicts a circuit for preventing chatter constructed in accordance with the prior art. Specifically, the circuit of FIG. 1 includes a D-type flip-flop 11 and a mechanical contact switch 12. Switch 12 is coupled to the D terminal input of D-type flip-flop 11, and a periodic pulse clock signal CL is provided to input CL of D-type flip-flop 11. The output of D-type flip-flop 11 is provided through terminal Q.

Figure 2:
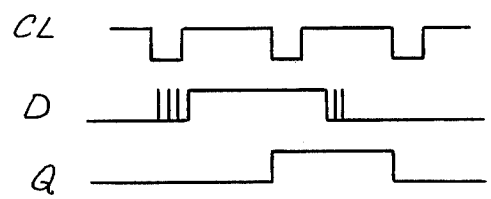
FIGS. 2 and 3 are wave diagrams depicting the operation of the circuit depicted in FIG. 1.

When switch 12 is open, a low or $\ominus$ input signal is provided through a resistance 13 to input D of flip-flop 11. When switch 12 is closed, a high or $\oplus$ input signal is provided to input D of flip-flop 11. Referring to the timing chart of FIG. 2, it is noted that the D terminal input of flip-flop 11 is read at a full timing of the clock signal CL and outputted through terminal Q. Chattering of the switch indicated by the spikes of the D signal in FIG. 2 is suppressed when outputted through terminal Q. Nevertheless, a chattering input may produce an erroneous output at terminal Q.

Figure 3:
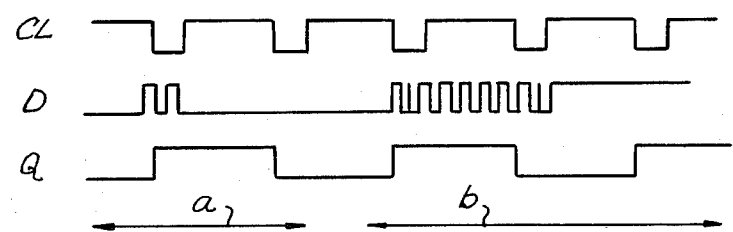

FIG. 3 is a timing chart for the circuit of FIG. 1 which illustrates an example where chattering of switch 12 may produce an erroneous output through terminal Q. During the period indicated by arrow a, noise is applied to switch input terminal D of flip-flop 11 instead of switch 12 being closed. In this case, where the noise is applied at a full timing of the clock signal CL, it is capable of being read as a switch input even though switch 12 is not closed. This will result in a high-level output signal from terminal output Q.

The timing indicated by arrow b in FIG. 3 depicts a case where chattering of the switch lasts for at least one period of the clock signal CL. In this second case, one switch operation is capable of indicating the switch input as coming two times, three times, etc. Accordingly, prior chattering preventive circuits would only effectively operate when the chattering period was of short duration. Although other types of chattering preventive circuits than that depicted in FIG. 1 have been employed, the problem described above, where the chattering lasts for a relatively long period of time, will not be avoided. The chattering preventive circuit of the present invention eliminates this problem.

Figure 4:
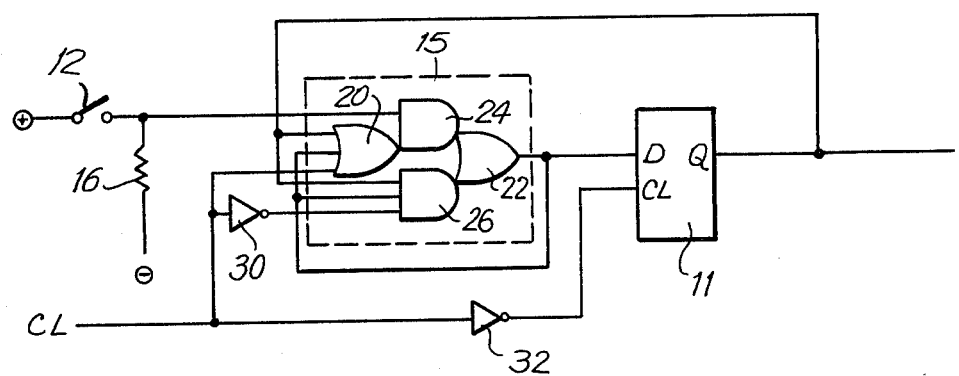
FIG. 4 is a circuit diagram of a chattering preventive circuit constructed in accordance with a preferred embodiment of the present invention.

Reference is now made to FIG. 4, which depicts the chattering preventive circuit according to a preferred embodiment of the present invention. The circuit of FIG. 4, in addition to having as a second memory circuit the D-type flip-flop 11 and the mechanical contact switch 12, includes a first memory circuit designated as 15. First memory circuit 15 reads and stores the low or $\ominus$ signal provided through a resistance 16 when switch 12 is open and a high or ⊕ input signal provided when switch 12 is closed. Second memory circuit 11 stores the write-in output signal of first memory circuit 15 and selectively provides an output signal through terminal Q thereof.

First memory circuit 15 includes first OR gate 20, second OR gate 22, first AND gate 24 and second AND gate 26. First OR gate 20 receives as inputs the periodic pulse signal CL, the write-in signal produced as an output from first memory circuit 15 and the output signal from second memory circuit 11. The output of first OR gate 20 and the input signal from switch 12 are inputted to first AND gate 24. The write-in signal produced by first memory circuit 15, the output signal produced by second memory circuit 11 and an inverted periodic pulse clock signal CL inverted through inverter 30 are applied as inputs to second AND gate 26. The outputs from first and second AND gates 24 and 26 are inputted into second OR gate 22. The output of the second OR gate 22, the write-in signal, is applied to terminal D of D-type flip-flop 11. An inverted periodic pulse clock signal CL inverted through an inverter 32 is applied to the CL terminal of D-type flip-flop 11.

When switch 12 is closed, an input state of switch 12 is read in first memory circuit 15 at a high or ⊕ level, that is, at a logic level 1 of the CL signal. Thereafter, the output of first memory circuit 15 is read in the second memory circuit 11 at a rise timing of the next CL signal. However, if switch 12 is opened before the write-in signal from first memory circuit 15 is read in the second memory circuit 11, the output of the first memory circuit 15 returns to a low or ⊖ level, that is, a logic level 0, which cannot be read as an input to the second memory circuit 11. For example, if the period of the CL signal is 1/128 sec. and the duration of the high or logic level 1 signal is 1/1,024 sec., the input state cannot be read unless switch 12 is kept perfectly closed for between 6.8 m sec. and 14.6 m sec. or longer.

Figure 5:
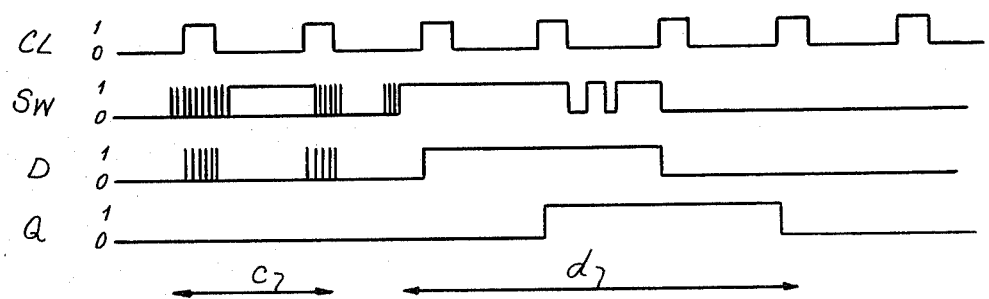
FIG. 5 is a wave diagram depicting the operation of the circuit depicted in FIG. 4.

Reference is now made to FIG. 5, which depicts various timings for the signals produced by the circuit depicted in FIG. 4. During the period indicated by arrow c, the switch input $S_w$ is not read. The period indicated by arrow d is a case where the switch input $S_w$ is read and an output through terminal Q of flip-flop 11 is produced. During the timing indicated by arrow d, the illustration is such that the switch input $S_w$ is at a low or logic level 0 duration after it is read, that is, after the output Q of second memory circuit 11 becomes high at a logic level of 1. However, the input will not be read as being off, in this case, unless switch 12 is kept open for a constant period of time, namely, 6.8 m sec. through 14.6 m sec. or longer.

Thus, the switch input becomes active after switch 12 is kept closed for a constant period of time (6.8 m sec.-14.6 m sec.) or longer, and the switch must be kept open for a constant period of time or longer to change the switch input state from active to reactive. Therefore, after an output is produced through terminal Q, unless switch 12 is thereafter kept opened for a predetermined period of time or longer, a second output through terminal Q will not occur even though switch 12 is closed again.

The chattering preventive circuit depicted in FIG. 4 according to the present invention is constituted such that first memory circuit 15 reads a closed or ON state of the switch input upon the coincidence of the CL signal, with the CL signal being kept at logic level 1, and holds it when the CL signal is at logic level 0. However, if the switch input comes to an OFF state even in the slightest or during the holding period of time, the output of the first memory circuit 15 will return to its original state. Then, in case an OFF state of the switch input is read where the switch input is kept in an active state (the state where the output Q of the second memory circuit 11 is kept at logic level 1), it is read likewise while the CL signal is at logic level 1 and held while the CL signal is at logic level 0. If the switch input comes to an ON state even in the slightest during the holding period of time, the first memory circuit 15 returns to its original state.

Table 1 below is a truth table for the logic equation representative of first memory circuit 15. The logic equation of first memory circuit 15 is obtained through the truth table of Table 1 as:

$$D = S \cdot (C + Q + D) + \overline{C} \cdot D \cdot Q.$$

where S is the switch input, D the output of the first memory circuit 15, Q the output of second memory circuit 11, and C a clock signal to control the reading of the switch input.

TABLE 1

| S | C | D | Q | D |
|---|---|---|---|---|
| 0 | 0 | 0 | 0 | 0 |
| 1 | 0 | 0 | 0 | 0 |
| 0 | 1 | 0 | 0 | 0 |
| 1 | 1 | 0 | 0 | 1 |
| 0 | 0 | 1 | 0 | 0 |
| 1 | 0 | 1 | 0 | 1 |
| 0 | 1 | 1 | 0 | 0 |
| 1 | 1 | 1 | 0 | 1 |
| 0 | 0 | 0 | 1 | 0 |
| 1 | 0 | 0 | 1 | 1 |
| 0 | 1 | 0 | 1 | 0 |
| 1 | 1 | 0 | 1 | 1 |
| 0 | 0 | 1 | 1 | 1 |
| 1 | 0 | 1 | 1 | 1 |
| 0 | 1 | 1 | 1 | 0 |
| 1 | 1 | 1 | 1 | 1 |

Any chattering by switch 12 can be prevented by utilizing the chattering preventive circuit of the present invention as described above, and ON/OFF timing of the switch input can be readily employed in any switches by changing the period and duty ratio of the clock signal CL accordingly. The present chattering preventive circuit is particularly useful in miniature portable equipment such as calculators and watches. For example, a buzzer-driving circuit and lamp-driving circuit in an electronic clock or watch will provide a noise source against the switch input, and the noise can be perfectly prevented through the switch input by the present invention. This can be realized easily by a slight increase of the circuit burden as compared with that in a conventional chattering preventive circuit.

It will thus be seen that the objects set forth above, and those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A chattering preventive circuit comprising switch means for producing an input signal representative of the open and closed states of said switch means, first and second periodic pulse signals, first memory means for receiving said input signal and said first periodic pulse signal and for producing a write-in signal representative of the coincidence of said input signal and said first periodic pulse signal, second memory means for receiving said write-in signal and said second periodic pulse signal, said second memory means producing an output signal representative of the closed state of said switch means only when said switch means is kept closed for at least a predetermined time period, said second memory means not producing the next output signal representative of another closing of said switch means unless said switch means first remains open for at least a predetermined time period, said first memory means receiving said output signal from said second memory means as an input, said write-in signal produced by said first memory means being applied as an input to said first memory means, said first memory means including first and second OR gates and first and second AND gates, said first periodic pulse signal, write-in signal and output signal being inputted into said first OR gate, the output of said first OR gate and said input signal being inputted into said first AND gate, said first periodic pulse signal, write-in signal and output signal being inputted into said second AND gate, the outputs from said first and second AND gates being inputted into said second OR gate, the output of said second OR gate being said write-in signal.

2. A chattering preventive circuit comprising switch means for producing an input signal representative of the open and closed states of said switch means, first and second periodic pulse signals, first memory means for receiving said input signal and said first periodic pulse signal and for producing a write-in signal representative of the coincidence of said input signal and said first periodic pulse signal, second memory means for receiving said write-in signal and said second periodic pulse signal, said second memory means producing an output signal representative of the closed state of said switch means only when said switch means is kept closed for at least a predetermined time period, said second memory means not producing the next output signal representative of another closing of said switch means unless said switch means first remains open for at least a predetermined time period, the output of said first memory means being represented by the logic equation:

$$D = S \cdot (C + Q + D) + \overline{C} \cdot D \cdot Q,$$

where S is the switch means input signal, D is the write-in signal output of said first memory means, Q is said output signal of said second memory means, and C is said first periodic pulse signal.

3. The chattering preventive circuit as claimed in claim 1 or 2 wherein said second memory means includes a D-type flip-flop.

4. The chattering preventive circuit as claimed in claim 3, wherein said second periodic pulse signal is inverted prior to being inputted to said second memory means.

5. The chattering preventive circuit as claimed in claim 1, wherein said second periodic pulse signal is inverted prior to being inputted to said second memory means.

6. The chattering preventive circuit as claimed in claim 5, wherein said first periodic pulse signal is inverted prior to being inputted to said second AND gate.

7. The chattering preventive circuit as claimed in claim 1, wherein the output of said first memory means is represented by the logic equation:

$$D = S \cdot (C + Q + D) + \overline{C} \cdot D \cdot Q,$$

where S is the switch means input signal, D is the write-in signal output of said first memory means, Q is said output signal of said second memory means, and C is said first periodic pulse signal.

8. The chattering preventive circuit as claimed in claim 6, wherein the output of said first memory means is represented by the logic equation:

$$D = S \cdot (C + Q + D) + \overline{C} \cdot D \cdot Q,$$

where S is the switch means input signal, D is the write-in signal output of said first memory means, Q is said output signal of said second memory means, and C is said first periodic pulse signal.

9. The chattering preventive circuit as claimed in claim 1 or 2, wherein said first periodic pulse signal and said second periodic pulse signal are the same.

* * * * *